(12) United States Patent
Knechtel et al.

(10) Patent No.: US 7,790,569 B2
(45) Date of Patent: Sep. 7, 2010

(54) PRODUCTION OF SEMICONDUCTOR SUBSTRATES WITH BURIED LAYERS BY JOINING (BONDING) SEMICONDUCTOR WAFERS

(75) Inventors: Roy Knechtel, Geraberg (DE); Andrej Lenz, Tittmoning (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 734 days.

(21) Appl. No.: 10/580,361

(22) PCT Filed: Nov. 29, 2004

(86) PCT No.: PCT/DE2004/002638

§ 371 (c)(1),
(2), (4) Date: Apr. 18, 2007

(87) PCT Pub. No.: WO2005/053018

PCT Pub. Date: Jun. 9, 2005

(65) Prior Publication Data

US 2008/0036041 A1  Feb. 14, 2008

(30) Foreign Application Priority Data

Nov. 28, 2003  (DE) ................. 103 55 728

(51) Int. Cl.
*H01L 21/30* (2006.01)
(52) U.S. Cl. .............. 438/455; 438/458; 438/459
(58) Field of Classification Search .............. None
See application file for complete search history.

(56) References Cited

U.S. PATENT DOCUMENTS

| 4,939,101 | A | * | 7/1990 | Black et al. ............ 438/455 |
| 5,232,870 | A | * | 8/1993 | Ito et al. ............... 438/455 |
| 5,980,633 | A | * | 11/1999 | Yamagata et al. ......... 117/94 |
| 6,455,398 | B1 | * | 9/2002 | Fonstad et al. .......... 438/459 |
| 6,583,029 | B2 | * | 6/2003 | Abe et al. ............. 438/455 |
| 6,627,519 | B2 | * | 9/2003 | Kwon et al. ............ 438/459 |
| 6,653,206 | B2 | * | 11/2003 | Yanagita et al. ......... 438/458 |
| 7,129,172 | B2 | * | 10/2006 | Morrow et al. .......... 438/690 |

FOREIGN PATENT DOCUMENTS

| EP | 0 451 993 A2 | 10/1991 |
| EP | 1 107 295 A2 | 6/2001 |
| EP | 1 189 266 A1 | 3/2002 |

OTHER PUBLICATIONS

Q.-Y.Tong and U. Gosele; Semiconductor Wafer Bonding: Science and Technology; 1999; Part 1—Book pp. 1-139; John Wiley & Sons, Inc.; New York, NY.
Q.-Y.Tong and U. Gosele; Semiconductor Wafer Bonding: Science and Technology; 1999; Part 2—Book pp. 140-297; John Wiley & Sons, Inc.; New York, NY.

* cited by examiner

*Primary Examiner*—Scott B Geyer
(74) *Attorney, Agent, or Firm*—Stevens & Showalter LLP

(57) ABSTRACT

The invention relates to a method for producing semiconductor substrates by bonding. The aim of said method is to reduce the non-usable edge region on the bonded wafer component and to improve the edge geometry of the wafer composite. This is achieved by a method for joining two semiconductor wafers using a semiconductor wafer bonding process. The surfaces of the two semiconductor wafers that are to be bonded are provided with a border or edge geometry that has a special short front-end facet. After the bonding process, one of the two wafers is ablated to obtain an edge region that is as devoid as possible of defects and a usable wafer surface that is as large as possible.

27 Claims, 1 Drawing Sheet

PRODUCTION OF SEMICONDUCTOR SUBSTRATES WITH BURIED LAYERS BY JOINING (BONDING) SEMICONDUCTOR WAFERS

BACKGROUND OF THE INVENTION

The invention relates to a method of manufacturing semiconductor substrates and an assembly thereof, in particular of silicon substrates, e.g., for SOI or MEMS, by bonding two semiconductor wafers (bonding) and thinning (for instance, splitting or separating) one of the two wafers, thereby providing the advantage of a reduced edge defect area, which is achieved by a specific "edge rounding" of the semiconductor wafers to be bonded. The bonded wafers are considered as a wafer composite in the sense of a "bonded wafer assembly".

For the fabrication of semiconductor substrates including patterned and non-patterned buried levels, as for instance in the SOI or MEMS technology, typically two silicon wafers are connected to each other in a laminar manner (bonded). This technique was developed by Tong and Goesele and is referred to as Semiconductor Wafer Bonding, cf., Science and Technology of Semiconductor Wafer Bonding, Tong/Goesele, John Wiley and Sons, USA (1999), ISBN 0-471-57481-3, December 1998.

In this case on one or both wafer surfaces to be bonded are located in the layer to be buried or a system of layers, which may not be positioned at the surface due to the manufacturing process.

After bonding one of the two wafers is thinned, for instance, by grinding/etching/polishing, or separated parallel with respect to a predetermined break plane that is not located within the bonding plane, for example, in SOI layer transfer techniques. The remaining wafer including the layer structure is referred to as device wafer, while the thinned or separated wafer may be referred to as donator wafer and may be used, if required, for other purposes after separation.

EP-A 451 993 (Shin-Etsu) discloses a method for manufacturing a substrate for semiconductor devices. Two semiconductor wafers are connected to each other by "semiconductor wafer bonding", wherein an edge geometry is provided on the wafers to be bonded, which allows as much as possible to provide a defect-free perimeter region and a large usable wafer surface after reducing the thickness of one of the wafers. In this method wafers of different diameters are used so that after the thinning a geometry according to FIG. 1 in this document is obtained relative to a geometry of the perimeter and edge region based on a technology referred to as prior art according to FIG. 3c in this document. Associated flattenings (referred to as "bevels" w8, w5) are indicated without reference to the wafer diameter are provided with scale factors such that the inner edge or the inner ends of both flattenings are radially located substantially equally, while the outer ends are intentionally not located in this manner, cf., column 6, lines 25 to 37. As a result, facets of different length and a protruding edge of the larger wafer are obtained after the thinning is performed.

If wafers of a standard edge geometry are used for the connection (bonding), a faulty or even a completely missing connection is caused (non-bonded regions). After the thinning or separation or splitting apart of the donator wafer the layer (stack) transferred from the donator wafer to the device wafer may delaminate in these regions.

Consequently, an edge region that is non-usable for the device fabrication and a non-defined edge geometry causing a negative technological affect, i.e., causing increased effort and preparation errors, are obtained.

One reason causing the non-bonded wafer edge region is the standard edge geometry of the wafer having a relatively long facet at the wafer surfaces to be bonded. In the vicinity of the facets a mechanical contact may not be established between the wafers to be bonded, which is a prerequisite for creating a bonding connection. The non-defined wafer edge area resulting therefrom after the thinning of the donator wafer caused difficulties in the further manufacturing process of the device wafer, e.g. issues with respect to resist coating and focussing (photolithography). The non-usable edge zone, which may typically reach up to 7 mm from the wafer edge into the interior of the wafer surface, also results in a significant loss of usable wafer surface. This loss may amount to about 9% for a 150 mm wafer.

It is the (technical) object of the present invention to provide a method for forming semiconductor substrates by bonding such that the non-usable edge region of the device wafer is reduced and the edge geometry is enhanced.

BRIEF SUMMARY OF THE INVENTION

The object is solved by the features of claims 1 or 20. Alternatively, by the features of claims 24 or 26.

The method of claim 1 provides the advantage of significantly reducing the non-usable edge zone. Preferably, it is reduced to less than 1 mm distance from the wafer edge, that is, for a 150 mm diameter wafer to approximately 2% (or less than 2.6%) of the wafer surface area (claims 11 to 13). Furthermore, the edge geometry of the wafers to be bonded according to the present invention provides advantages during the thinning near the intermediate bond layer (bond interface). Since the facet of the donator wafer at the end thickness of the device wafer becomes a portion that is substantially perpendicular to the wafer surface, the risk of breaking off of material will significantly be reduced (claim 14).

Additionally, the (laterally) short facets at the bond interface significantly reduce the risk of an unintended disengagement of the wafers during wafer handling, since the unintended insertion of a separating member (tweezers, cassette border) into the short narrow remaining gap is less probable. In this way substrates having an increased effectively usable surface area and enhanced edge geometry are obtained. The latter provides an increased process margin.

The connection of the semiconductor wafers for providing a composite of two individual wafers is accomplished by a bond interface of laminar nature (claim 8). This bond interface or the surfaces of the wafers to be bonded define a reference plane with respect to position information, such as perpendicular or inclined. This coordinate system is referenced to the wafer composite and not to the manner as to how and in which orientation this wafer composite is fabricated. For example, the thickness of the two wafers is to considered perpendicular with respect to the above-identified reference surface (reference plane). A nominal measure of the wafer, such as 150 mm, is to considered with respect to this plane (claim 16).

If the individual wafers forming the wafer composite have substantially the same diameter prior to the thinning process (claim 17), this diameter is also to taken in the above-identified reference plane.

The thinned wafer (claim 1) receives a reduced thickness compared to the device wafer during the thinning process. A thinning process is generally to be understood as any type of reducing the thickness of the donator wafer (claim 2).

Both wafers (claims 3, 4) may have formed thereon one or more prepared layers, which result in an transfer of structures at the bond interfaces (claim 2). These layers, which are buried layers within the composite and which may be used for SOI or MEMS, are not explicitly illustrated and may readily be added in the drawings by the skilled person (claim 5).

The wafers may have nominal dimensions between 100 mm to 300 mm when a circular design is considered; however, even larger wafers up to 450 mm or 500 mm may be used (claims 24, 6, 7). Due to identical rated diameters for circular wafer geometries an area loss at protruding edges of the larger wafers may be avoided. Also, the preparation effort may be reduced.

More precise prescriptions with respect to the dimensions and the magnitude of the specifically shortened edge area are included in claims 11 to 13. After thinning an edge geometry is obtained in the wafer having the reduced thickness and remaining on the device wafer as a transferring layer, which is substantially perpendicular with respect to the above-mentioned reference surface (claims 14, 15). A protruding of this wafer beyond the edge facet of the thicker wafer is avoided (claims 14, 15).

By using a polishing process during preceding process steps and due to the new facet particularly being reduced in its lateral extension preferably two differently inclined facets are generated, wherein the inclination are defined with respect to the reference surface (claim 18). The angles of inclination are neither 90° nor 0°, but are in an intermediate range. Both inclination angles define oblique surfaces located radially outside the bond interfaces. The oblique surface located radially more outwardly is, measured in the oblique direction, shorter and in particular is significantly shorter compared to the oblique surface located further inwardly, which originates from a polishing process (edge roll off). This holds true for both semiconductor wafers bonded via the bond interface.

The statements according to the above considerations also hold true for the wafer composite (claim 20), wherein in this case also a claim in view of "product by process" would also be appropriate, which however was not selected in favour of the structural features of the wafer of claim 20.

A reference of the device features to these claims 20 or 26 provides the features for the more precisely defined configuration of the wafer composite formed of two bonded semiconductor wafers (claim 23).

BRIEF DESCRIPTION OF THE SEVERAL VIEWS OF THE DRAWINGS

The invention will be explained and complemented by illustrative embodiments, wherein it is to be appreciated that the following representation is a description of the preferred embodiments of the invention.

DETAILED DESCRIPTION OF THE INVENTION

Figure 1:
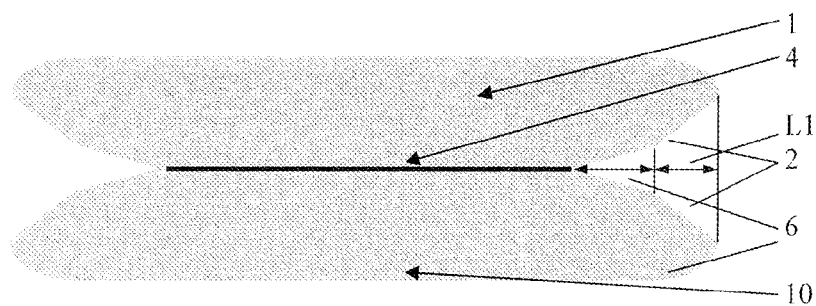
FIG. 1 shows Si wafers connected by bonding and having standard edge geometry (a schematic exaggerated representation).

For the fabrication of substrates having patterned and non-patterned buried levels (SOI wafer, a specific MEMS substrate) typically two wafers 1 and 10 are connected in a laminar manner, which is referred to as bonding or "bonded", cf., FIG. 1. This is prior art.

In this case, the buried layers/structures are provided on one or both of the surfaces to be bonded.

A reason for the faulty or completely missing connection in the wafer edge region X is the edge geometry 5 having long facets 2 at the surfaces to be bonded, which additionally result, during the polishing process of the surfaces to be bonded in an extended edge area, in a gradual flattening (known as "edge roll-off") of the wafer surface. The extension of the slight flattening may extend more than approximately 100 µm up to several mm from the edge. Long facets 2 are to be understood as having a length $L1 \gg 75$ µm to approximately 400 µm (to be read as L1 "significantly greater" than the measures indicated).

Both effects (long facet and edge roll-off) may cause that during bonding the wafers at the edge areas may partially not contact each other, which is the most important precondition for achieving a connection as a laminar bond into face, as is provided in the region 4.

After the bonding one of the two wafers is "thinned" (reduced, polished or separated, in particular split off). In this way a more or less thin layer of the donator wafer 1 is transferred to the device wafer 10.

The technique described with reference to the prior art according to the FIGS. 1, 2 may—unless otherwise specified—be applied to the manufacturing process and to the wafer structure of to bonded wafers resulting from this manufacturing process.

Figure 2:
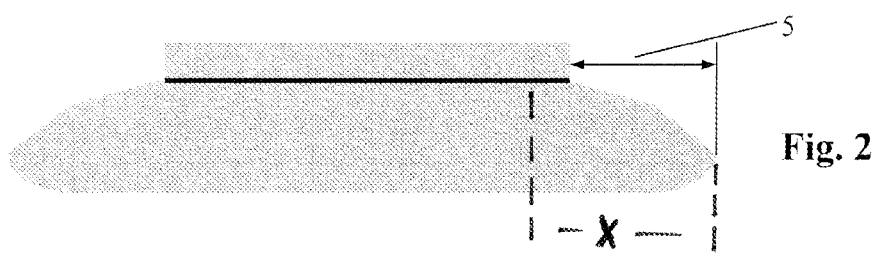
FIG. 2 illustrates the bonded Si wafers of FIG. 1 in a stage after the thinning process, in particular after the separation or splitting off of the donator wafer (a schematic exaggerated representation).
Figure 3:
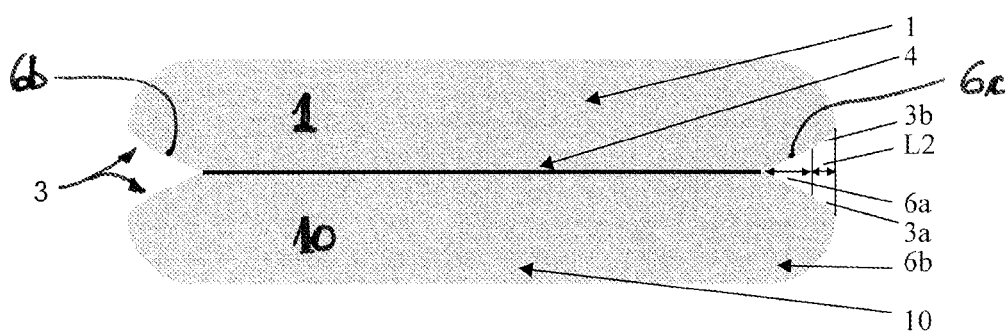
FIG. 3 illustrates two semiconductor wafers connected by bonding and having formed short facets at the wafer surfaces to be bonded (a schematic exaggerated representation).

In FIG. 3 a manufacturing stage is shown, in which the two wafers are already bonded to each other via the bond interface 4 to form a wafer composite 1, 4, 10 including an upper donator wafer and a lower device wafer that are connected by the interface 4 attaching both wafers to each other in a laminar manner. In the edge region 7 it is evident that it is significantly reduced and in the direction of the reference surface (with respect to bond interface 4) it appears shorter compared to that edge region 2 of the prior art having a greater length L1. Consequently, a reduced region of influence of this edge region is expected, which is referred to as K in FIG. 4 at the new shorter appearing edge geometry 7 according to FIGS. 4 and 3. The edge influence region K is thus smaller than the edge influence region X of FIG. 2.

Figure 4:
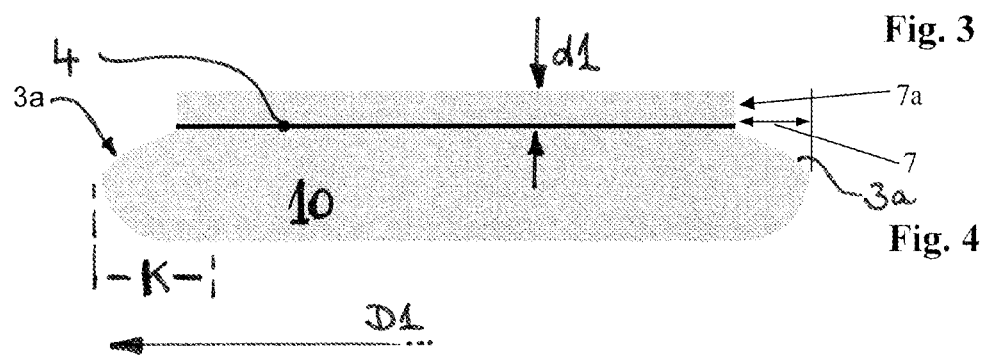
FIG. 4 are the bonded semiconductor wafers of FIG. 3 after the thinning/separating/splitting off process of the donator wafer 1 (a schematic exaggerated representation).

The situation, in which the upper device wafer 1 has been thinned, for example by grinding, splitting-off or other separation techniques, is shown in FIG. 4 as a semiconductor substrate having a layer not illustrated but readily imaginable, which is prepared or which comprises electronic devices or carries MEMS. The bond interface 4 serves a basis for a comparison and acts as a reference plane.

After the separation a substantially vertically oriented peripheral edge 7a having a rated diameter D1 in the remaining thin layer d1, wherein the peripheral edge 7a is located in the periphery or edge region 7. To this edge region 7 and its geometry also belong the very short facet 3a (in the wafer 10) and the very short facet 3b of the donator wafer 1. The further flattening 6a (first wafer) and 6c (second wafer) created by the edge roll-off causes a different inclination with respect to the reference plane relative to the short facets 3a or 3b.

Figure 5:
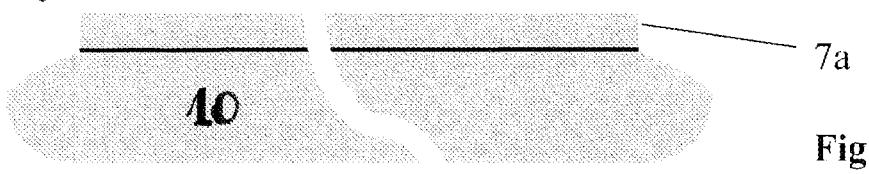
FIG. 5 corresponds to FIG. 4 with a section through the centre in order to demonstrate the dimensions of the edge region K and the usable area of a wafer composite.

After the bonding and the reduction of the thickness of the donator wafer 1 the assembly of FIG. 4 (vertical section) is obtained, wherein the size may be illustrated more efficiently in FIG. 5 in order to demonstrate the dimensions of the edge regions with respect to the rated diameter of a circular wafer. In this case, wafers having a size of more than 100 mm up to 500 mm may be used and the measures indicated relate to the respective rated measure of 150 mm for a circular wafer assembly.

Due to the partially insufficient connection of the wafer surfaces according to FIG. 2 mechanical and/or chemical damage, such as cracks, penetration of liquids by capillary effects, etc. in the extended edge region 5 may be created during the splitting, back-polishing or separating the donator wafer. This defective region X extends up to 7 mm.

This edge region 5 is not available for a further use of the (bonded) device wafer and may additionally cause further issues during the further processing, for instance trapping of contaminations, etc.

In order to avoid these disadvantageous wafers 1, 10 having a specific edge geometry are used for the bonding according to FIG. 3, wherein the edge geometry is characterised by a particularly short facet 3 on the sides to be bonded. Preferably, a length L2<75 μm for wafers having a typical diameter of 100 mm to 300 mm, preferably also above these dimensions up to a diameter D1 in the range of 500 mm is used.

The facet 6b on the back side may (but does not necessarily have to) be respectively longer.

The very short facets 3a at the surfaces to be bonded reduce a further flattening of the surfaces to be bonded in the edge region 7 during the polishing process (edge roll-off).

As a consequence, during the bonding of wafers having the described periphery or edge geometry 7 a significantly reduced edge defect zone K and thus a larger usable surface of the device wafer may be obtained.

The reduced number of edge defects also reduces the problems during the further processing of the device wafer (a reduced trapping of contaminations at edge cracks, etc.).

The edge region having a reduced number of defects is obtained in a reduced manner compared to the prior art of FIG. 1. In FIG. 3 less than 7 mm is obtained for a diameter D1 of substantially 150 mm, from which it may be calculated that the wafer surface is affected significantly less than 9% by the edge defects K such that the useable area may be increased for the same rated dimension.

The edge defect zone K extends less far into the wafer geometry having the same rated dimension, and in particular extends less than 5% or less than 2.6% of the wafer surface. In one calculation example values of approximately 2% of the wafer surface with respect to a rated dimension of 150 mm may be obtained.

Expressed in absolute size values this corresponds to an edge region having edge defects of less than 1 mm as circumferential stripes with a circular geometry and substantially the same rated dimensions of the two individual wafers 1, 10.

LIST OF REFERENCE SIGNS 1, 10: Semiconductor wafers to be bonded
2: Facets of lengths L1, here long
3a, 3b: Facets of lengths L2, here short
4: Bond interface
5: Extension of the defective (not sufficiently bonded) edge region:
  Edge defect zone, here reaching further into the interior of the wafer.
6, 6a, 6b: Edge roll-off, flattened zone at the edge of the wafer caused by polishing.
7: Extension of the defective (not sufficiently bonded) edge region:
  Edge defect zone K, here significantly less reaching into the interior of the wafer.
7a: Perpendicular region (vertical edge section)
K: Smaller edge defect zone
D1: Diameter of the HL wafers (semiconductor wafers)
d1: Thinned thickness/material strengths of donator wafer 1

We claim:

1. A method for bonding two semiconductor wafers having surfaces to be bonded by a semiconductor wafer bonding process, comprising:
  providing a periphery or edge geometry including a front side facet having a length, measured in a direction of the surface, of less than 75 μm in each of the two semiconductor wafers at the surfaces to be bonded;
  bonding the two semiconductor wafers at the surfaces to be bonded;
  thinning one of the two semiconductor wafers to produce a thinned layer bonded on the other one of the two wafers.

2. The method for bonding according to claim 1, wherein at least one of the surfaces to be bonded includes at least one prepared layer or structures, which are transferred by the bonding and a subsequent thinning from the other one of the semiconductor wafers to the one of the semiconductor wafers.

3. The method for bonding according to claim 2, wherein the one of the semiconductor wafers is a donator wafer or a top wafer.

4. The method for bonding of claim 2, wherein the other one of the wafers is a device wafer or a handle wafer.

5. The method for bonding of claim 2, wherein both surfaces to be bonded each include a prepared layer or structures.

6. The method for bonding of claim 1, wherein the semiconductor wafers have a diameter between 100 mm to 500 mm.

7. The method for bonding of claim 1, wherein the two wafers to be bonded have a diameter in the range of 300 mm to 500 mm, and both wafers have substantially the same diameter prior to the bonding and the thinning of the one of the wafers.

8. The method for bonding of claim 1, wherein the bond surfaces are connected via a laminar bond interface.

9. The method for bonding of claim 1, wherein the front sides of the semiconductor wafers are the oppositely arranged surfaces to be bonded to each other via a bond interface.

10. The method for bonding of claim 1, wherein the edge geometry surrounds a bond interface at the periphery geometry.

11. The method for bonding of claim 1, wherein a non-usable edge region is provided having less than 7 mm for a diameter of the semiconductor wafers of 150 mm.

12. The method for bonding of claim 11, wherein said non-usable edge region is less than 5% of the wafer surface.

13. The method for bonding of claim 12, wherein the non-usable edge region is less than 2.6% or less than 2% of the wafer surface.

14. The method for bonding of claim 1, wherein said non-usable edge region is less than approximately 1 mm for a diameter of the semiconductor wafer of approximately 150 mm.

15. The method for bonding of claim 1, wherein at the periphery or edge geometry at the end thickness of the thinned one of the wafers a substantially perpendicular section or portion is provided that is formed from the edge facet of the thinned wafer.

16. The method for bonding of claim 15, wherein said substantially perpendicular section is oriented perpendicularly to a laminar bond interface or to the wafer surface.

17. The method for bonding of claim 1, wherein said two semiconductor wafers have substantially the same dimensions in the direction of the bond or wafer surfaces, and in particular said two semiconductor wafers have substantially the same diameter corresponding to a rated dimension.

18. The method for bonding of claim 1, wherein said two semiconductor wafers have the same diameter.

19. The method for bonding of claim 1, wherein said periphery or edge geometry comprises two differently inclined facets that are inclined in a range less than 90° and greater than 0° with respect to a bond interface.

20. The method for bonding of claim 1, wherein a bond interface or the wafer surface defines a reference plane.

21. The method of claim 1, wherein first oblique faces formed from the facets that are shorter than second oblique faces located radially further inwardly and originating from an edge roll-off process, the dimensions being measured along a direction of extension of the respective oblique face of the respective semiconductor wafer.

22. The method of claim 1, wherein thinning is one of grinding, splitting off and separating.

23. The method for bonding of claim 1, wherein a non-usable edge region is provided having less than 9% of a wafer surface.

24. An assembly as a composite of two semiconductor wafers connected by a semiconductor bonding process, wherein the bonded semiconductor wafers are provided at the bonded surfaces with an edge geometry having a front side facet less than 75 μm for a wafer diameter ranging from 100 mm to 300 mm so as to obtain an edge region after thinning, as one of separation or splitting off of one of the wafers.

25. The assembly of claim 24, wherein one or both of the bonded surfaces include prepared layers or other structures, which are transferred by the bonding and the subsequent thinning/separating of the one wafer from the other wafer.

26. The assembly of claim 24, wherein the thinning comprises a separating process.

27. The assembly of claim 24, wherein first oblique faces formed from the facets that are shorter than second oblique faces located radially further inwardly and originating from an edge roll-off process, the dimensions being measured along a direction of extension of the respective oblique face of the respective semiconductor wafer.

* * * * *